CIRCUIT ARRANGEMENT FOR AMPLIFYING ELECTRIC SIGNALS

Filed Oct. 14, 1968

INVENTOR.
GERRIT WOLF
ROBERT C. THUIS
BY
Frank R. Trifari
AGENT

United States Patent Office 3,525,050

Patented Aug. 18, 1970

3,525,050

CIRCUIT ARRANGEMENT FOR AMPLIFYING ELECTRIC SIGNALS

Gerrit Wolf and Robbert Carel Thuis, Nijmegen, Netherlands, assignors, by mesne assignments, to U.S. Philips Corporation, New York, N.Y., a corporation of Delaware Filed Oct. 14, 1968, Ser. No. 767,314
Int. Cl. H03g *3/30;* H03f *3/16*
U.S. Cl. 330—29 2 Claims

ABSTRACT OF THE DISCLOSURE

Amplifier utilizing a field effect transistor and employing a high value resistor connected between source and drain and having the effect of compensating the transistor for unwanted voltage variation.

The invention relates to a circuit arrangement for amplifying electric signals comprising a field-effect transistor having a source electrode, a drain electrode and, viewed from the source electrode to the drain electrode, a first insulated gate electrode and a second insulated gate electrode, the electric signals being applied to the first gate electrode and derived from the drain electrode, whilst for the control of the amplification of the arrangement means are provided for varying the direct voltage of the second gate electrode in a range between a first value, at which the field-effect transistor has an adjustment suitable for the amplification of weak signals and a second value at which the field-effect transistor is substantially cut off.

Such amplifying circuits are advantageous employed, for example, for the amplification of high-frequency or medium-frequency signals in radio or television receivers, since they have a number of advantageous properties, i.e. a high amplification factor, a low noise factor, a simple arrangement and an automatic gain control which requires only a control-voltage and does not need control-energy.

The known amplifying circuits of the kind set forth have, however, the disadvantage that a progressive amplification control involves considerable modulation distortion and cross modulation due to the non-linear properties of the field-effect transistor.

The invention has for its object to provide an amplifying circuit arrangement of the kind set forth, in which by very simple means a considerable reduction of the modulation distortion or of the cross modulation is obtained and in this respect the amplifying circuit according to the invention is characterized in that further means are provided for applying to the first gate electrode a direct voltage, which is constant relative to a reference potential and which has a polarity rendering the field-effect transistor conducting and in that between the source electrode and the point of reference potential there is provided a resistor which is decoupled preferably for the signal frequencies and which has such a high value that owing to the direct-voltage variation of the second gate electrode and the accompanying variation of the direct current flowing though the field-effect transistor and through the resistor the resistor has produced across it a direct-voltage variation which causes the direct voltage of the first gate electrode with respect to the source electrode to vary in a sense opposite the direct-voltage variation at the second gate electrode in a range which is at least equal to the difference between the direct voltage of the first gate electrode relative to the source electrode in said adjustment for amplifying weak signals and the voltage at the first gate electrode relative to the source electrode which substantially cut off the field-effect transistor.

The invention will be described more fully with reference to the figures of the drawing, in which FIG. 1 shows an amplifying circuit embodying the invention.

Figure 1:
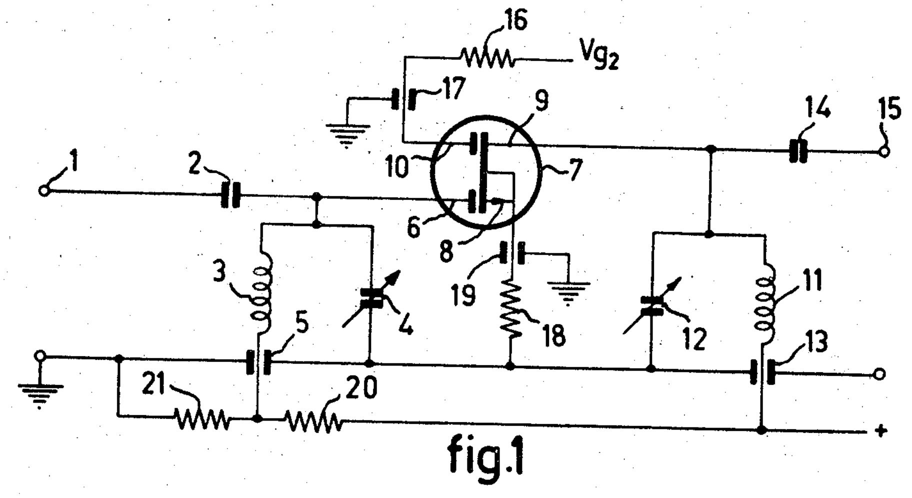

In the amplifying circuit of FIG. 1 the signals to be amplified are applied to an input terminal 1 and then through a capacitor 2 to a tunable resonant circuit including an inductor 3 and a variable capacitor 4, which serves for tuning the circuit to the desired signal frequency. The lower end of the inductor 3 is connected for the signal frequencies to earth potential through a through-connection capacitor 5. The signal across the resonant circuit 3, 4 is applied to a first gate electrode 6 of a field-effect transistor 7, which may be of the N-channel depletion type N213BF. This field-effect transistor comprises a semiconductor body having a source electrode 8 and a drain electrode 9, whilst the first gate electrode 6 and the second gate electrode 10 are insulated from the semiconductor body.

The drain electrode 9 has connected to it a tunable resonant circuit comprising an inductor 11 and a variable capacitor 12. The lower end of the inductor 11 is connected to earth potential for the signal frequency via a through-connection capacitor 13. The tuning of the resonant circuit 11, 12 is preferably varied in synchronism with the tuning of the resonant circuit 3, 4. The amplified signal appearing across the resonant circuit 11, 12 is applied through a capacitor 14 to an output terminal 15.

For the control of the amplification of the circuit a variable control-voltage $V_{G2}$ is applied through a resistor 16 to the second gate electrode 10 of the field-effect transistor. The second gate electrode is connected to earth potential for the signal frequencies by means of a through-connection capacitor 17.

The source electrode 8 of the field-effect transistor is connected to earth potential via a resistor 18 and a through-connection capacitor 19 connects the source electrode for the signal frequencies to earth potential. The supply voltage required for the operation of the transistor to be applied to the drain electrode is derived from the positive terminal (+) of a supply voltage source (not shown) through the through-connection capacitor 13 and the inductor 11. This voltage may be for example +20 v. With the aid of a voltage divider comprising two resistors 20 and 21 and connected between the positive terminal (+) of the supply voltage source and earth a positive direct voltage of, for example, +3 v. is obtained, which is applied through the capacitor 5 and the inductor 3 to the first gate electrode 6 of the field-effect transistor.

Figure 2:
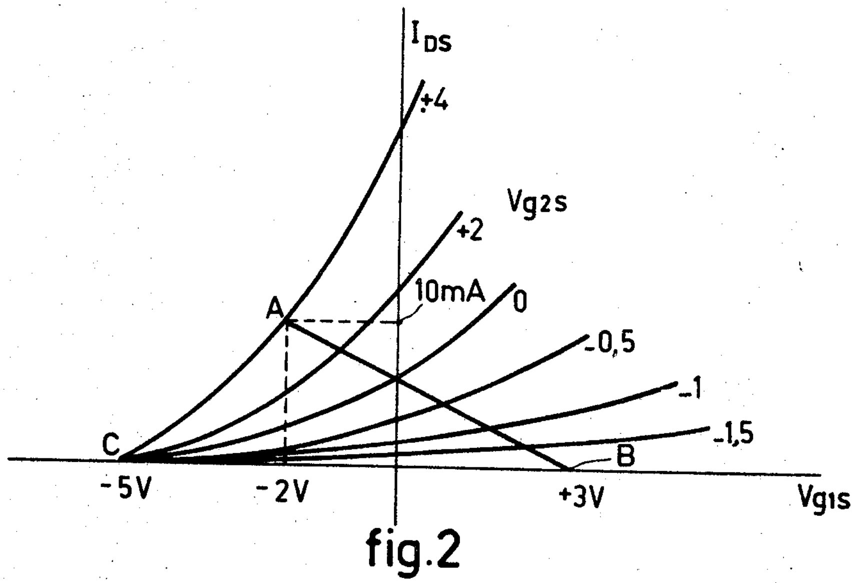
FIG. 2 is a diagram for explaining the operation of the circuit of FIG. 1.

FIG. 2 shows the characteristic curves of the field-effect transistor shown in FIG. 1, the voltage $V_{G1S}$ between the first gate electrode and the source electrode being plotted horizontally and the current $I_{DS}$ flowing through the drain electrode and the source electrode being plotted vertically for different values of the voltage $V_{G2S}$ between the second gate electrode and the source electrode.

For the amplification of weak signals the field-effect transistor is adjusted to the point A. This point of adjustment is chosen so that the transistor provides a high amplification and the noise factor is at a minimum. With the double-gate field-effect transistor type N213BF the voltage applied via the resistor 16 is adjusted so that the voltage $V_{G2S}$ between the second gate electrode and the source electrode is +4 v., the voltage $V_{G1S}$ between the first gate electrode and the source electrode is −2 v. and the current $I_{DS}$ through the source and drain electrodes is 10 ma.

If higher signals are applied to the amplifying arrangement, the voltage $V_{G2}$ at the second gate electrode is reduced. The production of the control-voltage $V_{G2}$ does not form part of the invention; it may be carried out by any known circuitry for producing an automatic gain control-voltage.

According to the invention the resistor 18 is chosen to be comparatively high, for example, 470 ohms. By this resistor it is achieved that, when the voltage at the second gate electrode is reduced, the voltage between the first gate electrode and the source electrode is appreciably shifted in the positive direction. This is illustrated in detail in FIG. 2. When the voltage $V_{G2S}$ is reduced, the point of adjustment shifts from point A along a straight line to point B. At point B the current $I_{DS}$ is equal to zero; the transistor is therefore cut off so that the amplification is at a minimum (the attenuation is at a maximum respectively). It is known to control the gain of a double-gate field-effect transistor by varying the voltage at the second gate electrode without the use of a resistor in the supply lead of the source electrode or with the use of a comparatively small resistor which serves for stabilising the transistor with respect to temperature fluctuations, production tolerances or ageing. The line along which the point of adjustment shifts then extends from point A vertically or substantially vertically downwards. The invention is based on the recognition of the fact that by using a comparatively high resistor 18 and by the attendant horizontal shift of the working point in a positive direction a considerable reduction of the cross modulation and the modulation distortion at the reception of high signal amplitudes and a further increase of the control-range are obtained.

Practice has shown that this reduction of distortion is obtained to a marked extent only when such a high resistor 18 is used that the resultant shift of the voltage $V_{G1S}$ of the first gate electrode relative to the source electrode is at least equal to the difference between the voltage at the first gate electrode relative to the source electrode at the nominal point of adjustment A and the voltage of the first gate electrode relative to the source elecrode at which the transistor is cut off (point C in FIG. 2). In other terms, the difference between $V_{G1S}$ at point B and $V_{G1S}$ at point A is chosen at least equal to and preferably higher than the difference between $V_{G1S}$ at point A and $V_{G1S}$ at point C.

The invention is based on the following recognitions:

With weak input signals the transistor operates in a substantially linear portion of the $I_{DS}$–$V_{G1S}$ characteristic curve so that there is no risk of distortion. With higher input signals, however, the transistor is operative in a portion of the characteristic curve which is no longer linear. This applies particularly to the cut-off point C. By the measure according to the invention the point of adjustment of the transistor is shifted further away from the cut-off point C simultaneously with the increase in input signal amplitude so that the risk of distortion is considerably reduced.

Figure 3:
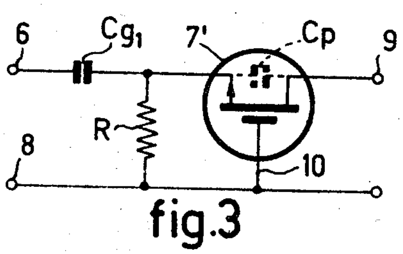
FIG. 3 is a substitute diagram of the field-effect transistor of the circuit shown in FIG. 1.

A second cause of the reduction of the distortion will be explained more fully with reference to FIG. 3, which shows a substitute diagram of the transistor 7. In this figure the capacitor $C_{G1}$ represents the capacitance of the first gate electrode relative to the semiconductor body and R designates the resistance of the current path in the semiconductor body for the part controlled by the first gate electrode. The remaining part of the double-gate field-effect transistor 7 is indicated as a single-gate field-effect transistor 7', the drain electrode of which corresponds with the drain electrode 9 of the transistor 7 and the gate electrode of which corresponds with the second gate electrode 10 of the transistor 7. From this substitute diagram it will be apparent that the signals applied between the first gate electrode 6 and the source electrode 8 are operative across a voltage divider formed by the capacitor $C_{G1}$ and the resistor R, whilst the portion of the signal voltage appearing across the resistor R controls the single-gate field-effect transistor 7'. Since owing to the comparatively high resistor 18 the voltage $V_{G1S}$ is shifted in a positive direction with a progressive control, the resistor R of FIG. 3 is considerably reduced. As a result, a progressively smaller portion of the input voltage controls the part 7' of the field-effect transistor so that the distortion produced therein is reduced accordingly.

A further advantage of the circuit according to the invention resides in that an enlargement of the gain control range is obtained. At the end of the gain control range (point B in FIG. 2) the part 7' of the field-effect transistor is substantially cut off. The signal current still flowing to the drain electrode is produced substantially completely by the parasitic capacitance of the part 7' of the field-effect transistor indicated in FIG. 3 by $C_p$. Therefore, it is the signal current passing through said parastic capacitance which determines mainly the value of the gain control range. Since, however, as stated above, the resistor R is considerably reduced with a progressive control so that this resistor practically constitutes a short-circuit to earth between the capacitances $C_{g1}$ and $C_p$, the parasitic signal current via the capacitance $C_p$ is appreciably reduced so that the gain control range is correspondingly increased.

It should be noted that a field-effect transistor having two gate electrodes exhibits great similarity with a cascode circuit known from the tube or bipolar transistor technology. The measure according to the invention, however, cannot be carried out in the same manner in such cascode circuits. This is due to the fact that with tubes the voltage between the grid and the cathode cannot become positive, since this would give rise to the flow of grid current. A shift of the point of adjustment to the region of positive grid voltages (see FIG. 2) is therefore not possible. In similar circuits having bipolar transistors the base-emitter junction of the first transistor is always conducting and low-ohmic so that quite different phenomena than in the present invention are implied. For this reason it is essential in the circuit according to the invention for the gate electrodes of the transistor to be insulated from the semi-conductor body.

In the circuit according to the invention an N-channel field-effect transistor or a P-channel field-effect transistor may be employed either of the depletion type or of the enhancement type. With field-effect transistors of the depletion type the $I_{DS}$–$V_{G1S}$ characteristic curves extend both in the region of negative and in the region of positive $V_{G1S}$ voltages (see FIG. 2); with field-effect transistors of the enhancement type, however, these characteristic curves extend only in a region of the same polarity of the voltage $V_{G1S}$.

It should be noted that in the circuit according to the invention it is necessary to use a field-effect transistor having a high maximum permissable voltage (for example 8 v.) between the first gate electrode and the source electrode, since the transistor has to deal not only with the high input signals but also with the direct voltage shifted strongly with respect to the cut-off point.

What is claimed is:

1. A circuit arrangement for amplifying electric signals comprising a field effect transistor having a source electrode, a drain electrode, a first insulated gate electrode and second insulated gate electrode, said first gate electrode receiving said electric signal, said transistor providing an output from said drain electrode, means connected to said second gate electrode for applying thereto a direct voltage variable between a first value point for amplication of weak signals and a second value point at which said transistor is substantially cut off, means for applying to said first gate electrode a direct voltage which is constant relative to a point of reference potential and which has a polarity rendering said transistor conducting, a resistor connecting said reference point to said source electrode, said resistor having a direct voltage variation produced thereacross by the direct current variation therethrough, said direct current variation resulting from the variation of said variable direct voltage applied to said second gate electrode, said resistor having a value such that said direct voltage variation thereacross varies the direct voltage between said first gate electrode relative to said source electrode in a sense opposite to the direct voltage variation at said second gate electrode, said direct voltage variation across said resistor occurring over a range at least equalling the difference between the direct voltage at said first gate electrode realtive to said source electrode at said first value point and the direct voltage at said first gate electrode relative to said source electrode at which said transistor is substantially cut off.

2. An amplifying circuit as claimed in claim 1, wherein said field-effect transistor is of the depletion type, and said voltage at the first gate electrode relative to the source electrode, wherein said field-effect transistor is substantially cut off, has a first polarity and the direct voltage at the first gate electrode realtive to the source electrode has the opposite polarity over at least part of the range of variation of said direct voltage.

References Cited

UNITED STATES PATENTS 3,443,240 5/1969 Santilli ------------ 330—38 X

ROY LAKE, Primary Examiner

J. B. MULLINS, Assistant Examiner

U.S. Cl. X.R.

330—35, 38